(12) United States Patent
Sahara et al.

(10) Patent No.: US 6,852,616 B2
(45) Date of Patent: Feb. 8, 2005

(54) SEMICONDUCTOR DEVICE AND METHOD FOR PRODUCING THE SAME

(75) Inventors: Ryuichi Sahara, Hirakata (JP); Kazumi Watase, Kyoto (JP); Takahiro Kumakawa, Takatsuki (JP); Kazuyuki Kainoh, Hirakata (JP); Nozomi Shimoishizaka, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 92 days.

(21) Appl. No.: 10/165,279

(22) Filed: Jun. 10, 2002

(65) Prior Publication Data

US 2002/0151104 A1 Oct. 17, 2002

Related U.S. Application Data

(62) Division of application No. 09/984,191, filed on Oct. 29, 2001, now Pat. No. 6,512,298.

(30) Foreign Application Priority Data

Nov. 29, 2000 (JP) ........................................ 2000-362625

(51) Int. Cl.[7] .............................................. H01L 21/44
(52) U.S. Cl. ..................... 438/613; 438/612; 438/618; 438/623; 438/637; 438/642
(58) Field of Search ................... 438/612, 613, 438/618, 623, 637, 640, 642, 643

(56) References Cited

U.S. PATENT DOCUMENTS 3,461,357 A * 8/1969 Mutter et al. ............... 257/762
5,684,304 A * 11/1997 Smears ......................... 257/48
5,869,357 A * 2/1999 Zambrano .................... 438/129
5,933,752 A * 8/1999 Yanagida ..................... 438/613
6,111,317 A * 8/2000 Okada et al. ................ 257/737
6,300,234 B1 * 10/2001 Flynn et al. ................. 438/612
6,445,001 B2 * 9/2002 Yoshida ........................ 257/48

FOREIGN PATENT DOCUMENTS

| JP | 03-159152 | 7/1991 |
|----|-----------|--------|
| JP | 08-102466 | 4/1996 |
| JP | 08-222571 | 8/1996 |
| JP | 09-064049 | 3/1997 |
| JP | 11-068018 | 3/1999 |

OTHER PUBLICATIONS

Notice of reasons of rejection dated Sep. 16, 2003.

* cited by examiner

*Primary Examiner*—Tom Thomas
*Assistant Examiner*—N. Drew Richards
(74) *Attorney, Agent, or Firm*—Nixon Peabody LLP; Donald R. Studebaker

(57) ABSTRACT

A first element electrode and a second element electrode connected electrically to a semiconductor element on a substrate are formed, and then an insulating film is formed on the substrate including the element electrodes. Thereafter, a first opening for exposing the first element electrode and a second opening for exposing the second element electrode are formed on the insulating film. Then, a first external electrode connected to the first element electrode via the first opening is formed immediately above the first element electrode. Furthermore, a second external electrode and a connecting wire having one end connected to the second element electrode via the second opening and the other end connected to the second external electrode are formed on the insulating film.

10 Claims, 5 Drawing Sheets

SEMICONDUCTOR DEVICE AND METHOD FOR PRODUCING THE SAME

REFERENCE TO RELATED APPLICATION

This application is a division of Ser. No. 09/984,191 filed Oct. 29, 2001 now U.S. Pat. No. 6,512,298.

BACKGROUND OF THE INVENTION

The present invention relates to a semiconductor device and a method for producing the same that has a built-in integrated circuit section used for information communication equipment or electronic equipment for offices and allows a high-density packaging provided with wires or electrodes that connect the semiconductor integrated circuit section to the terminals of external equipment.

Recently, with compactness, high density and high functionality of electronic equipment, compactness and high density have been required for semiconductor devices. To satisfy this need, a technique to form CSP (chip size package) within semiconductor wafers has come to be used (Japanese Laid-Open Patent Publication No. 8-102466). The CSP formed within a semiconductor wafer is called a wafer level CSP even after a semiconductor wafer is divided into chips.

Hereinafter, a conventional semiconductor device and a production method thereof will be described in detail in reference with the accompanying drawings.

FIG. 5 is a cross-sectional view of a conventional semiconductor device, more specifically, a conventional wafer level CSP.

As shown in FIG. 5, in the conventional wafer level CSP, a plurality of element electrodes 101 that are electrically connected to semiconductor elements are formed on a semiconductor wafer 100 in which the semiconductor elements are arranged in respective semiconductor chip forming regions (not shown). The surface of the semiconductor wafer 100 is covered with a passivation film 102 in which a plurality of openings 102a are arranged in order to expose the element electrodes 101. On the passivation film 102, a plurality of Cu wires 103 that are connected to the element electrodes 101 via the openings 102a are formed. The surface of each of the Cu wires 103 is covered with a Ni-plated layer 104. On the passivation film 102, a cover coating film (protective film) 105 is formed so as to cover the Cu wires 103 as well as Ni-plated layer 104. In the cover coating film 105, a plurality of openings 105a are formed so as to expose a plurality of external electrodes 106 that are formed of a portion of the Cu wires 103 (including the Ni-plated layer 104) and are two-dimensionally arranged. A plurality of solder bumps 107 connected to the external electrodes 106 via the openings 105a are formed immediately above the external electrodes 106 as external electrode terminals.

The outline of a method for producing the conventional wafer level CSP is as follows.

First, a passivation film 102 is formed by spin-coating on the whole surface of the semiconductor wafer 100 provided with semiconductor elements and a plurality of element electrodes 101 electrically connected to the semiconductor elements in respective semiconductor chip forming regions. Then, a plurality of openings 102a is formed in the passivation film 102 so as to expose the element electrodes 101 by well-known techniques of photolithography and etching.

Next, a plurality of Cu wires 103 are formed on the semiconductor wafer 100 via the passivation film 102 so as to extend within the inner portion of respective semiconductor chip forming regions and to be connected to the element electrodes 101 via the openings 102a. Thereafter, a Ni-plated layer 104 is formed on the Cu wires 103 by electroless plating.

Then, a cover coating film 105 is formed so as to cover the Cu wires 103, and then a plurality of openings 105a are formed on the cover coating film 105 in order to expose a plurality of external electrodes 106 that are formed of a portion of the Cu wires 103 and arranged two-dimensionally by well-known techniques of photolithography and etching. Thereafter, a plurality of solder bumps 107 that are connected to the external electrodes 106 via the openings 105a are formed immediately above the external electrodes 106 as external electrode terminals.

As described above, according to the wafer level CSP that is a conventional semiconductor device, the external electrodes 106 that are connected to the respective element electrodes 101 can be arranged two-dimensionally regardless of the arrangement of the element electrodes 101, so that compact semiconductor device can be produced, and therefore, equipment such as information communication equipment can also be made small in size.

However, in the conventional semiconductor device, there exists a resistance in the wires connecting the element electrodes to the external electrodes (for example, Cu wires) in addition to a resistance in the wires connecting the semiconductor elements to the element electrodes (for example, Al wires). Because of the resistance, signal delay is increased and the problem is caused that high-speed transmission of signals between the semiconductor device and external equipment becomes difficult.

SUMMARY OF THE INVENTION

Therefore, with the foregoing in mind, it is an object of the present invention to provide a semiconductor device that allows high-speed transmission of signals between the semiconductor device and external equipment while compactness is achieved.

In order to achieve the above object, a semiconductor device of the present invention includes a semiconductor substrate provided with at least one semiconductor element, a first element electrode and a second element electrode formed on the semiconductor substrate and connected electrically to the semiconductor element, an insulating film formed so as to cover the first element electrode and the second element electrode, a first opening formed on the insulating film and exposing at least one portion of the first element electrode, a second opening formed on the insulating film and exposing at least one portion of the second element electrode, a first external electrode formed immediately above the first element electrode and connected to the first element electrode via the first opening, a second external electrode formed on the insulating film and a connecting wire formed on the insulating film and having one end connected to the second element electrode via the second opening and the other end connected to the second external electrode.

The semiconductor device of the present invention includes a first external electrode formed immediately above the first element electrode and connected to the first element electrode. Therefore, the first element electrode and the first external electrode are connected without a wire, so that the resistance between the first element electrode and the first external electrode can be reduced and signal delay can be decreased. Thus, high-speed transmission of signals between the semiconductor device and external equipment becomes possible.

The semiconductor device of the present invention includes a second external electrode formed on the insulating film on the semiconductor substrate and a connecting wire formed on the insulating film and having one end connected to the second element electrode and the other end connected to the second external electrode. Therefore, regardless of the arrangement of the second element electrodes, the second external electrodes electrically connected to the second element electrodes can be arranged two-dimensionally, so that it is possible to provide multiple external electrode terminals in a small area. As a result, it becomes possible to realize a compact semiconductor device that is capable of including multiple pins.

Furthermore, according to the semiconductor device of the present invention, the first external electrode, the second external electrode and the connecting wire can be formed easily by patterning a conductive film formed on the semiconductor substrate to integrally form the first external electrode, the second external electrode and the connecting wire. Therefore, manufacturing cost can be reduced.

In the semiconductor device of the present invention, the semiconductor substrate may be a semiconductor wafer or a chip obtained by dividing a semiconductor wafer.

In the semiconductor device of the present invention, it is preferable that the insulating film is formed of elastic insulating material.

According to the semiconductor device as described above, in the case where the semiconductor device is mounted on a motherboard, even if the heating or cooling of the semiconductor device causes stress in the connection between the semiconductor device and the motherboard because of the difference in thermal expansion coefficient between the semiconductor device and the motherboard, the stress is reduced by the insulating film formed of elastic material, that is, the elastic layer. As a result, the possibility that the conductive pattern such as the external electrode or the connecting wire is disconnected is decreased, so that a highly reliable wiring structure can be realized.

In the semiconductor device of the present invention, it is preferable that each wall surface of the first opening and the second opening, or at least the portions near the upper end and near the lower end of the wall surface have an inclination of less than 90° with respect to the surface of the semiconductor substrate.

According to the semiconductor device as described above, the conductive pattern such as the external electrode or the connecting wire never straddles a sharp step, so that the conductive pattern is easily formed and hardly disconnected.

In the semiconductor device of the present invention, it is preferable that the semiconductor device further includes a pair of third element electrodes formed on the semiconductor substrate and electrically connected to the semiconductor elements, a pair of third openings formed on the insulating film and exposing at least one portion of each of the pair of third element electrodes and a coil formed on the insulating film and having ends, each of which is connected to a corresponding third element electrode of the pair via a corresponding third opening of the pair.

In the semiconductor device as described above, a coil with high L (inductance) value that has been difficult to form by the conventional semiconductor process can be realized by patterning the conductive film formed on the semiconductor substrate to form the coil. Therefore, semiconductor elements for high frequency can also be attained.

It is preferable that the semiconductor device of the present invention further includes a protective film formed so as to cover the first external electrode, the second external electrode and the connecting wire and having the property of repelling a conductive material, a fourth opening formed on the protective film and exposing at least one portion of the first external electrode, a fifth opening formed on the protective film and exposing at least one portion of the second external electrode, a first external electrode terminal formed immediately above the first external electrode and connected to the first external electrode via the fourth opening and a second external electrode terminal formed immediately above the second external electrode and connected to the second external electrode via the fifth opening.

According to the semiconductor device as described above, when mounting the semiconductor device on the motherboard, unfavorable electrical short-circuit is prevented between the first external electrodes, the second external electrodes or the connecting wires and wirings or electrodes of the motherboard, and the semiconductor device can be reliably mounted on the motherboard.

In the case where the semiconductor device includes the first external electrode terminals and the second external electrode terminals, it is possible to use metallic balls, conductive bumps or a portion of each of the first external electrodes and the second external electrodes as the first and second external electrode terminals. However, in any case, it is preferable that the junctions of the first external electrodes and the first external electrode terminals are covered with the protective film.

In the semiconductor device of the present invention, it is preferable to further include a passivation film covering the surface of the semiconductor substrate except the first element electrode and the second element electrode and that the insulating film is formed above the passivation film.

According to the semiconductor device as described above, the reliability of the semiconductor device can be improved.

In the case where the passivation film is included, it is preferable that the semiconductor device further includes a pair of third element electrodes formed on the semiconductor substrate and electrically connected to the semiconductor elements and a coil formed on the passivation film and having ends, each of which is connected to a corresponding third element electrode of the pair, and that the insulating film covers the coil.

According to the semiconductor device as described above, a coil with high L value that has been difficult to form by the conventional semiconductor process can be realized by patterning the conductive film formed on the semiconductor substrate to form the coil, so that the semiconductor elements for high frequency can be attained.

A method for producing a semiconductor device according to the present invention includes a first step of forming on a semiconductor substrate on which at least one semiconductor element is provided, a first element electrode and a second element electrode electrically connected to the semiconductor element, a second step of forming an insulating film so as to cover the first element electrode and the second element electrode, a third step of forming a first opening for exposing at least one portion of the first element electrode and a second opening for exposing at least one portion of the second element electrode by selectively removing an upper portion of each of the first element electrode and the second element electrode in the insulating film and a fourth step of forming a conductive film on the insulating film so as to fill up the first opening and the second opening and patterning the conductive film, thereby forming form a first external electrode connected to the first element electrode via the first opening immediately above the first element electrode, and forming a second external electrode and a connecting wire having one end connected to the second element electrode via the second opening and the other end connected to the second external electrode on the insulating film.

According to the method for producing a semiconductor device of the present invention, the first external electrode connected to the first element electrode is formed immediately above the first element electrode. Therefore, the first element electrode and the first external electrode are connected without a wire, so that the resistance between the first element electrode and the first external electrode can be reduced and signal delay can be decreased, so that high-speed transmission of signals between the semiconductor device and external equipment becomes possible.

According to the method for producing a semiconductor device of the present invention, the second external electrode and the connecting wire having one end connected to the second element electrode and the other end connected to the second external electrode are formed on the insulating film on the semiconductor substrate. Therefore, regardless of the arrangement of the second element electrodes, the second external electrodes electrically connected to the second element electrodes can be arranged two-dimensionally, so that it is possible to arrange multiple external electrode terminals in a small area. As a result, it becomes possible to realize a compact semiconductor device that is capable of including multiple pins.

Furthermore, according to the method for producing a semiconductor device of the present invention, the first external electrode, the second external electrode and the connecting wire are formed integrally by patterning a conductive film formed on the semiconductor substrate. Therefore, the first external electrode, the second external electrode and the connecting wire can be formed easily and thus manufacturing cost can be reduced.

In the method for producing a semiconductor device of the present invention, it is preferable that the semiconductor substrate is a semiconductor wafer, and the method further includes a step of dividing the semiconductor wafer into chips after the fourth step.

According to the method as described above, since the external electrodes, the connecting wires or the like can be formed collectively in respective semiconductor chip forming regions of the semiconductor wafer, manufacturing cost can be greatly reduced. In the method for producing a semiconductor device of the present invention, it is also possible that the semiconductor substrate is a chip obtained by dividing the semiconductor wafer.

In the method for producing a semiconductor device of the present invention, it is preferable that the insulating film is made of elastic insulating material.

According to the method as described above, in the case where the semiconductor device is mounted on a motherboard, even if the heating or cooling of the semiconductor device causes stress in the connection between the semiconductor device and the motherboard because of the difference in thermal expansion coefficient between the semiconductor device and the motherboard, the stress is reduced by the insulating film made of elastic material, that is, the elastic layer. As a result, the possibility that the conductive pattern such as the external electrode or the connecting wire is disconnected is decreased, so that a highly reliable wiring structure can be realized.

In the method for producing a semiconductor device of the present invention, it is preferable that the third step includes a step of forming each wall surface of the first opening and the second opening, or at least the portions near the upper end and near the lower end of the wall surface so as to have an inclination of less than 90° with respect to the surface of the semiconductor substrate.

According to the method as described above, the conductive pattern such as the external electrode or the connecting wire never straddles a sharp step, so that the conductive pattern is easily formed and hardly disconnected.

In the method for producing a semiconductor device of the present invention, it is preferable that the first step includes a step of forming a pair of third element electrodes electrically connected to the semiconductor elements on the semiconductor substrate, the third step includes a step of forming a pair of third openings for exposing at least one portion of each of the pair of third element electrodes by selectively removing an upper portion of the pair of third element electrodes in the insulating film, and the fourth step includes a step of forming a coil having ends, each of which is connected to a corresponding third element electrode of the pair via a corresponding third opening of the pair, on the insulating film by patterning the conductive film.

In the method as described above, a coil with high L value that has been difficult to form by the conventional semiconductor process can be realized. Therefore, semiconductor elements for high frequency can be attained.

In the method for producing a semiconductor device of the present invention, it is preferable that the method includes a fifth step of forming a protective film having a property of repelling a conductive material so as to cover the first external electrode, the second external electrode and the connecting wire and then selectively removing an upper part of each of the first external electrode and the second external electrode in the protective film to form a fourth opening for exposing at least one portion of the first external electrode and a fifth opening for exposing at least one portion of the second external electrode, after the fourth step.

According to the method as described above, when mounting the semiconductor device on the motherboard, unfavorable electrical short-circuit is prevented between and the first external electrodes, the second external electrodes or the connecting wires and wirings or electrodes of the motherboard, and the connection can be easily performed between the first external electrodes or the second external electrodes and the wirings or the electrodes of the motherboard with a connecting member such as solder.

In the case where the method includes the fifth step, it is preferable that the fifth step includes a step of forming a first external electrode terminal connected to the first external electrode via the fourth opening immediately above the first external electrode and forming a second external electrode terminal connected to the second external electrode via the fifth opening immediately above the second external electrode.

According to the method as described above, the semiconductor device can be mounted on the motherboard very easily.

In the method for producing a semiconductor device of the present invention, it is preferable that the first step includes a step of forming a pair of third element electrodes electrically connected to the semiconductor element on the semiconductor substrate, that the method includes, between the first step and the second step, a step of forming a passivation film covering the surface of the semiconductor substrate except the first element electrode, the second element electrode and the pair of third element electrodes, and then forming a coil having ends, each of which is connected to a corresponding third element electrode of the pair, on the passivation film, and that the insulating film covers the passivation film and the coil.

According to the method as described above, the reliability of the semiconductor device can be improved further. A coil with high L value that has been difficult to form by the conventional semiconductor process can be realized by patterning the conductive pattern formed on the semiconductor substrate to form the coil, so that the semiconductor elements for high frequency can be attained.

DETAILED DESCRIPTION OF THE INVENTION

Hereinafter, a semiconductor device and a method for producing the semiconductor device according to an embodiment of the present invention will be described in detail with reference to the accompanying drawings.

Figure 1:
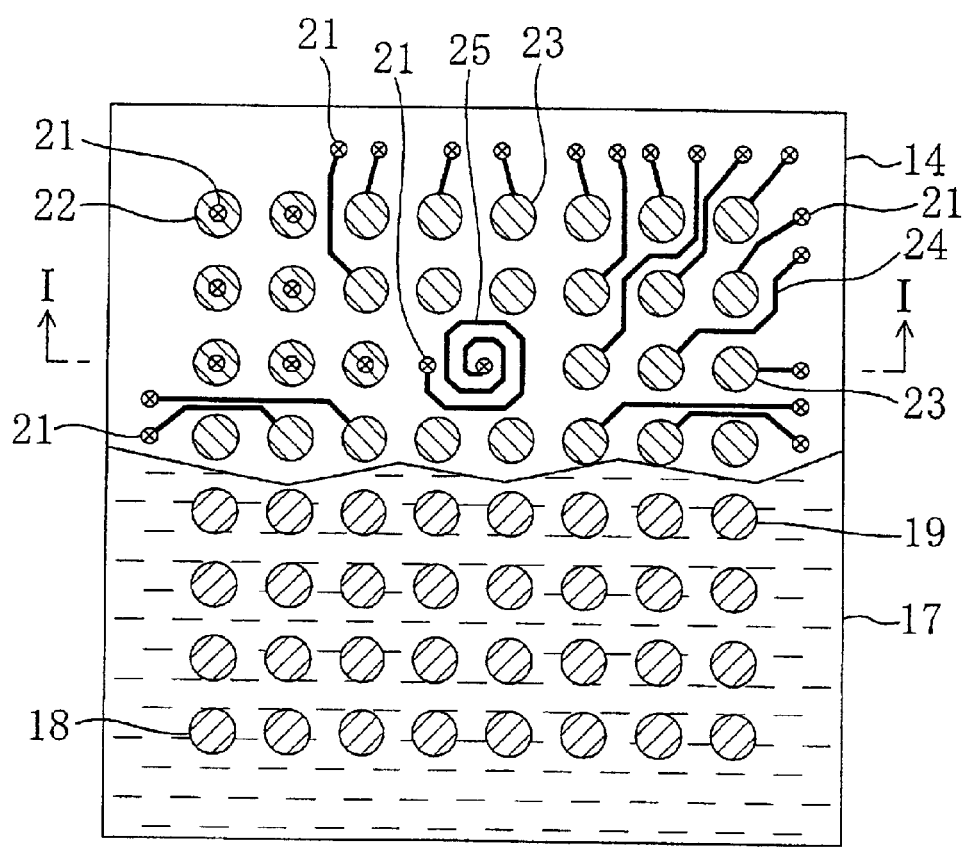
FIG. 1 is a plan view of a semiconductor device according to an embodiment of the present invention.
Figure 2:
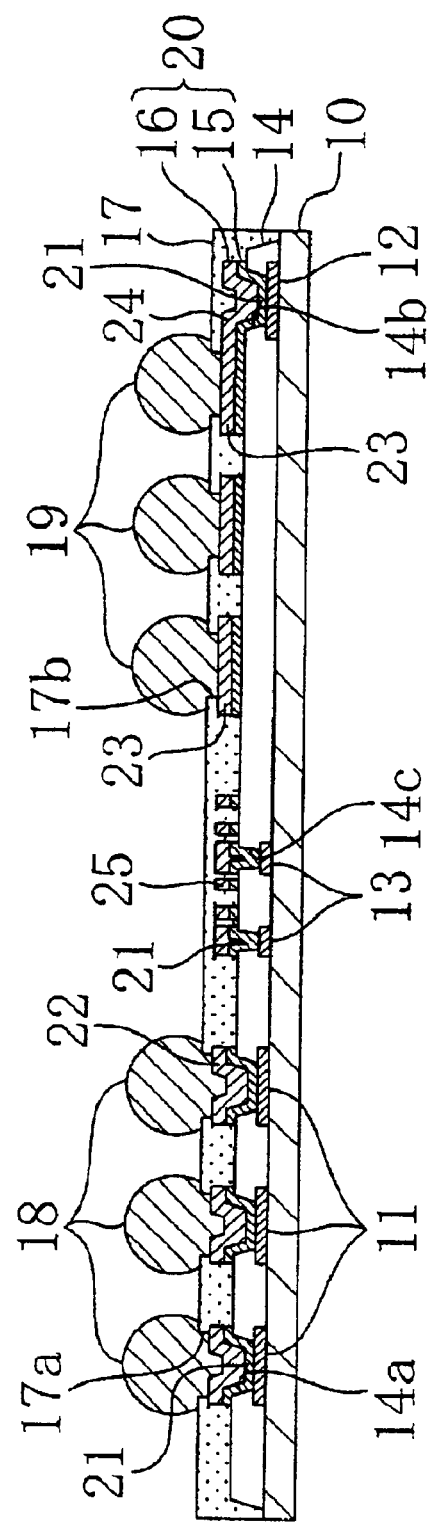
FIG. 2 is a cross-sectional view taken along line I—I of FIG. 1.

FIG. 1 is a plan view of a semiconductor device according to an embodiment, and FIG. 2 is a cross-sectional view taken along line I—I of FIG. 1. FIG. 1 is a partially cutaway view of the upper side of a semiconductor device according to an embodiment. In FIGS. 1 and 2, although not shown, a semiconductor integrated circuit including at least one semiconductor element such as a transistor is formed on a semiconductor substrate 10. Furthermore, in this embodiment, the semiconductor substrate 10 may be a semiconductor wafer or a chip obtained by dividing a semiconductor wafer.

As shown in FIGS. 1 and 2, a plurality of element electrodes for high-speed signals 11 are provided in the inner portion of a main surface of the semiconductor substrate 10, and a plurality of element electrodes for regular signals 12 are arranged in the periphery of the main surface of the semiconductor substrate 10. A pair of element electrodes for coil connection 13 is arranged in the inner portion of a main surface of the semiconductor substrate 10. The element electrodes 11 to 13 are electrically connected to semiconductor elements constituting a semiconductor integrated circuit provided in the semiconductor substrate 10.

On the semiconductor substrate 10, a low elastic modulus layer 14 made of a low elastic modulus material that has an insulating property is formed so as to cover the element electrodes 11 to 13. A plurality of first openings 14a for exposing the respective pad forming regions of the element electrodes for high-speed signals 11, a plurality of second openings 14b for exposing the respective pad forming regions of the element electrodes for regular signals 12 and a pair of third openings 14c for exposing the respective pad forming regions of the pair of element electrodes for coil connection 13 are formed in the low elastic modulus layer 14. The wall surface of the openings 14a to 14c has an inclination of less than 90° with respect to the surface of the semiconductor substrate 10.

Conductive patterns 20 including a thin metal layer 15 made of a laminate including a TiW film having a thickness of, for example, about 0.2 $\mu$m, and a Cu film having a thickness of, for example, about 0.5 $\mu$m and a thick metal layer 16 made of a Cu film having a thickness of, for example, about 10 $\mu$m are formed on the low elastic modulus layer 14 including the openings 14a to 14c.

The conductive patterns 20 include a plurality of pads 21 formed in the openings 14a to 14c and connected to the element electrodes 11 to 13, a plurality of lands for high-speed signals 22 formed immediately above the respective element electrodes for high-speed signals 11 and connected to the respective element electrodes for high-speed signals 11 via the pads 21, a plurality of lands for regular signals 23 formed on the low elastic modulus layer 14, a plurality of connecting wires 24 formed on the low elastic modulus layer 14 and having one end connected to the element electrode for regular signals 12 via the pad 21 and the other end connected to the land for regular signals 23, and a coil 25 formed on the low elastic modulus layer 14 and having ends, each of which is connected to a corresponding element electrodes for coil connection 13 of the pair via the pad 21. The lands for high-speed signals 22 serve as first external electrodes for input and output of signals between the element electrodes for high-speed signals 11 and external equipment. The lands for regular signals 23 function as second external electrodes for input and output of signals between the element electrodes for regular signals 12 and external equipment.

A solder resist film 17 having the property of repelling a conductive material is formed on the low elastic modulus layer 14 so as to cover the conductive patterns 20, and a plurality of fourth openings 17a for exposing at least a portion of the lands for high-speed signals 22 and a plurality of fifth openings 17b for exposing at least a portion of the lands for regular signals 23 are formed on the solder resist film 17. A plurality of first external electrode terminals 18 formed of metallic balls and connected to the lands for high-speed signals 22 via the fourth openings 17a are formed immediately above the lands for high-speed signals 22. A plurality of second external electrode terminals 19 formed of metallic balls and connected to the lands for regular signals 23 via the fifth openings 17b are formed immediately above the lands for regular signals 23.

Hereinafter, a method for producing the semiconductor device according to the embodiment shown in FIGS. 1 and 2 will be described with reference to the cross-sectional views showing a process sequence in FIGS. 3A to 3D and in FIGS. 4A to 4D.

Figure 3A:
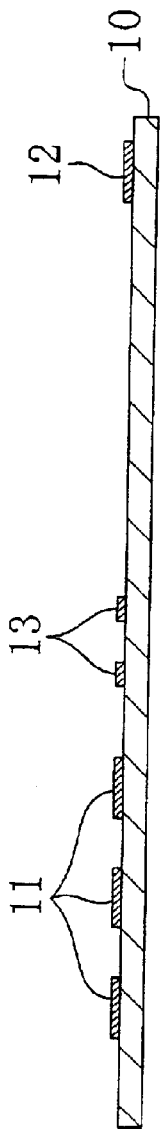
FIGS. 3A to 3D are cross-sectional views showing each process of a method for producing a semiconductor device according to an embodiment of the present invention.

First, as shown in FIG. 3A, a plurality of element electrodes for high-speed signals 11, a plurality of element electrodes for regular signals 12 and a pair of element electrodes for coil connection 13 are formed on the main surface of the semiconductor substrate 10.

Figure 3B:
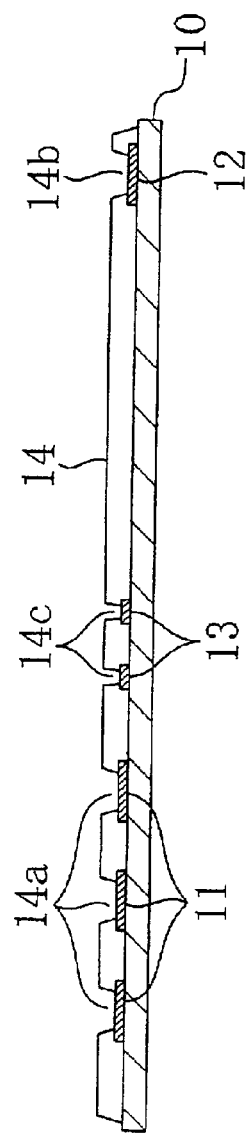

Next, a low elastic modulus layer 14 is formed on the semiconductor substrate 10 so as to cover the element electrodes 11 to 13 by applying a photosensitive insulating material having a thickness of about 20 $\mu$m onto the semiconductor substrate 10 and then drying. Thereafter, as shown in FIG. 3B, a plurality of first openings 14a for exposing pad forming regions of the element electrodes for high-speed signals 11, a plurality of second openings 14b for exposing the pad forming regions of the element electrodes for regular signals 12 and a pair of third openings 14c for exposing the respective pad forming regions of the pair of element electrodes for coil connection 13 are formed on the low elastic modulus layer 14 by well-known techniques for exposure and development. In this process, each wall surface of the openings 14a to 14c is processed so as to have an inclination of less than 90° with respect to the surface of the semiconductor substrate 10, for example, by causing flow of resin by applying heat rapidly to the low elastic modulus layer 14 in the curing process after development.

Figure 3C:
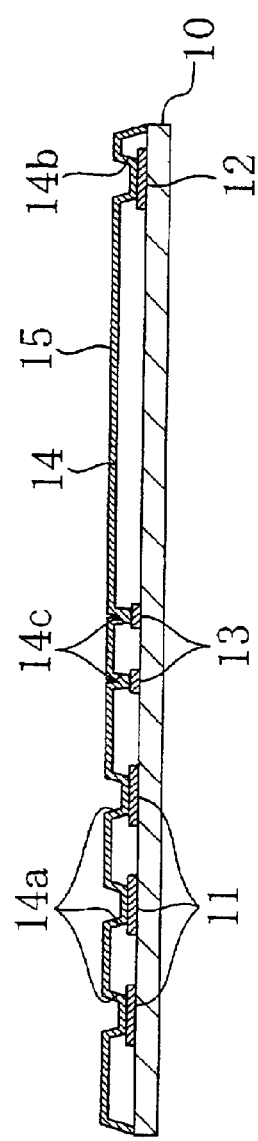

Then, as shown in FIG. 3C, a thin metal layer 15 formed of a laminate of a TiW film having a thickness of, for example, about 0.2 µm and a Cu film having a thickness of, for example, about 0.5 µm by sputtering, vacuum evaporation, CVD (chemical vapor deposition), electroless plating or the like is formed on the low elastic modulus layer 14 including the openings 14a to 14c.

Figure 3D:
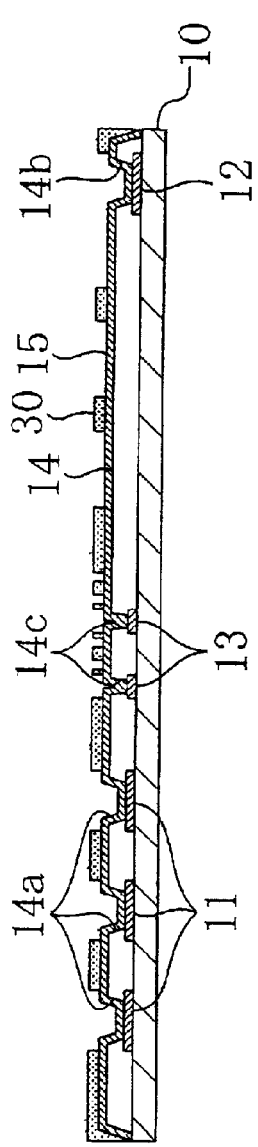

Then, a photosensitive resist of positive type is applied to the thin metal layer 15, and then exposure is performed so that only the conductive pattern forming regions in the applied resist are exposed to light. Thereafter, as shown in FIG. 3D, a plating resist film 30 is formed that covers the regions other than the conductive pattern forming regions by removing the light-exposed portion of the resist and curing the portion of the resist that is not exposed to light.

Figures 4A, 4B, 4C, 4D:
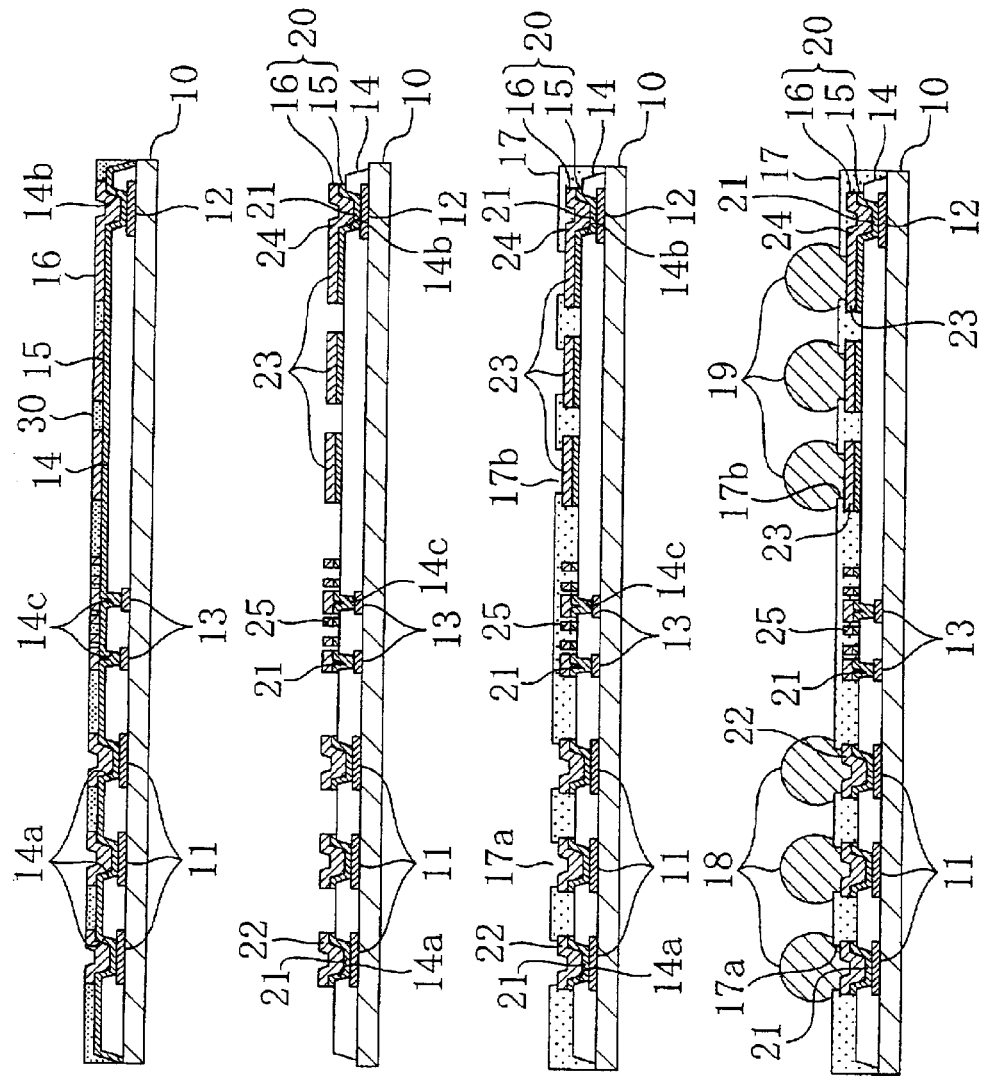
FIGS. 4A to 4D are cross-sectional views showing each process of a method for producing a semiconductor device according to an embodiment of the present invention.
Figure 5:
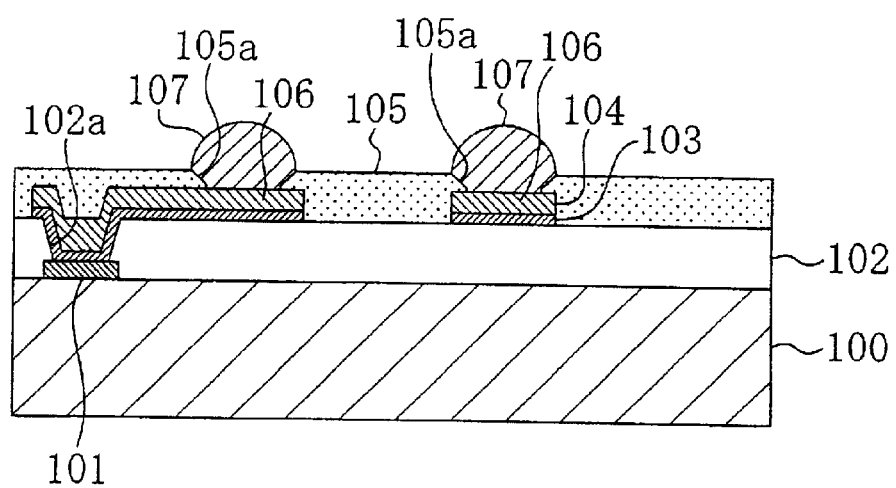
FIG. 5 is a cross-sectional view of a conventional semiconductor device.

Then, as shown in FIG. 4A, a thick metal layer 16 made of a Cu film having a thickness of about 10 µm is selectively formed by a thick film formation technique such as electroplating on the portions in the thin metal layer 15 where the plating resist film 30 is not formed, that is, on the conductive pattern forming regions in the thin metal layer 15.

Then, as shown in FIG. 4B, after melting and removing the plating resist film 30, exposed portions of the thin metal layer 15, that is, the portions in the thin metal layer 15 other than the conductive pattern forming regions, are molten and removed. More specifically, the Cu film constituting the thin metal layer 15 is subjected to etching with an etching solution composed of a cupric chloride solution, and the TiW film constituting the thin metal layer 15 is subjected to etching with an etching solution composed of a hydrogen peroxide solution. By this method, only the exposed portions of the thin metal layer 15 are removed prior to the thick metal layer 16 because the thin metal layer 15 is thinner than the thick metal layer 16. By the process shown in FIG. 4B, conductive patterns 20 made of the thin metal layer 15 and the thick metal layer 16 are formed. More specifically, a plurality of pads 21 connected to the element electrodes 11 to 13 are formed in the openings 14a to 14c. A plurality of lands for high-speed signals 22 connected to the element electrodes for high-speed signals 11 via the pads 21 are formed immediately above the element electrodes for high-speed signals 11. A plurality of lands for regular signals 23, a plurality of connecting wires 24 having one end connected to the element electrode for regular signals 12 via the pad 21 and the other end connected to the land for regular signals 23 and a coil 25 having ends, each of which is connected to a corresponding element electrode for coil connection 13 of the pair via the pad 21 are formed on the low elastic modulus layer 14.

Then, a solder resist film 17 is formed so as to cover the conductive patterns 20 by drying after applying a photosensitive solder resist to the low elastic modulus layer 14.

Thereafter, a plurality of fourth openings 17a for exposing at least a portion of the lands for high-speed signals 22 and a plurality of fifth openings 17b for exposing at least a portion of the lands for regular signals 23 are formed on the solder resist film 17 by a well-known photolithography technique as shown in FIG. 4C.

Then, as shown in FIG. 4D, metallic balls formed of solder, solder plated copper, nickel or the like are mounted on the lands for high-speed signals 22 or on the lands for regular signals 23 via the fourth openings 17a or the fifth openings 17b. Thereafter, a plurality of first external electrode terminals 18 connected to the lands for high-speed signals 22 and a plurality of second external electrode terminals 19 connected to the lands for regular signals 23 are formed by melting the metallic balls to be joined with the lands for high-speed signals 22 or the lands for regular signals 23. The portions of the conductive patterns 20 other than the lands for high-speed signals 22 and the lands for regular signals 23 are protected against the molten metallic balls by the solder resist film 17.

The semiconductor device of the embodiment shown in FIGS. 1 and 2 can be obtained by the above-described process shown in FIGS. 3A to 3D and FIGS. 4A to 4D.

According to an embodiment of the present invention, the element electrodes for high-speed signals 11 and the lands for high-speed signals 22 can be connected without wires because the lands for high-speed signals 22 connected to the element electrodes for high-speed signals 11 via the pads 21 are formed immediately above the element electrodes for high-speed signals 11. Therefore, the resistance between the element electrodes for high-speed signals 11 and the lands for high-speed signals 22 can be reduced and signal delay can be decreased, so that high-speed transmission of signals between the semiconductor device and external equipment becomes possible.

According to an embodiment of the present invention, the lands for regular signals 23 and the connecting wires 24 having one end connected to the element electrode for regular signals 12 via the pad 21 and the other end connected to the land for regular signals 23 are formed on the low elastic modulus layer 14 on the semiconductor substrate 10. Therefore, regardless of the arrangement of the element electrodes for regular signals 12, the lands for regular signals 23 electrically connected to the element electrodes for regular signals 12 can be arranged two-dimensionally, so that it is possible to provide multiple external electrode terminals in a small area. As a result, it becomes possible to realize a compact semiconductor device that is capable of including multiple pins.

According to an embodiment of the present invention, the land for high-speed signals 22, the land for regular signals 23 and the connecting wire 24 are formed integrally as a portion of the conductive patterns 20 by patterning the conductive film formed on the semiconductor substrate 10. Therefore, the lands for high-speed signals 22, the lands for regular signals 23 and the connecting wires 24 can be formed easily and thus manufacturing cost can be reduced.

According to an embodiment of the present invention, the conductive patterns 20 including the lands for high-speed signals 22, the lands for regular signals 23 and the like are formed on the semiconductor substrate 10 via the low elastic modulus layer 14. Therefore, in the case where the semiconductor device is mounted on a motherboard such as a printed board, even if the heating or cooling of the semiconductor device causes stress in the connection between the semiconductor device and the motherboard because of the difference in thermal expansion coefficient between the semiconductor device and the motherboard, the stress is reduced by the low elastic modulus layer 14. As a result, the possibility that the conductive patterns 20 are disconnected is decreased, so that a highly reliable wiring structure can be realized.

According to an embodiment of the present invention, each wall surface of the first openings 14a for exposing the element electrodes for high-speed signals 11, the second openings 14b for exposing the element electrodes for regular signals 12 and the pair of third openings 14c for exposing the pair of element electrodes for coil connection 13 has an inclination of less than 90° with respect to the surface of the semiconductor device 10. Therefore, the conductive patterns 20 never straddle a sharp step, so that the conductive patterns 20 are easily formed and hardly disconnected.

According to an embodiment of the present invention, the coil 25 having ends, each of which is connected to a corresponding element electrode for coil connection 13 of the pair via the pad 21 are formed on the low elastic modulus layer 14 by patterning the conductive film formed on the semiconductor substrate 10. Therefore, a coil with high L value that has been difficult to form by the conventional semiconductor process can be realized, so that semiconductor elements for high frequency can be attained.

According to an embodiment of the present invention, the solder resist film 17 having the property of repelling a conductive material is formed so as to cover the conductive patterns 20, and the first external electrode terminals 18 connected to the lands for high-speed signals 22 and the second external electrode terminals 19 connected to the lands for regular signals 23 are formed immediately above the lands for high-speed signals 22 and the lands for regular signals 23. Therefore, when mounting the semiconductor device on the motherboard, unfavorable electrical short-circuit is prevented between wirings or electrodes of the motherboard and the lands for high-speed signals 22, the lands for regular signals 23 or the connecting wirings 24, and the semiconductor device can be reliably mounted on the motherboard. At the same time, since metallic balls are used as the first external electrode terminals 18 and the second external electrode terminals 19, the semiconductor device can be mounted on the motherboard significantly easily.

In an embodiment of the present invention, it is preferable that the semiconductor substrate 10 is a semiconductor wafer, and after the processes shown in FIGS. 3A to 3D and FIGS. 4A to 4D, the methods includes a process of dividing the semiconductor wafer into chips. By this process, the low elastic modulus layer 14, the conductive patterns 20 or the like can be formed collectively in the respective semiconductor chip forming regions of the semiconductor wafer, so that manufacturing cost can be reduced.

In an embodiment of the present invention, there is no particular limitation regarding the arrangement positions of the element electrodes for high-speed signals 11, the element electrodes for regular signals 12 or the pair of element electrodes for coil connection 13 on the main surface of the semiconductor substrate 10.

In an embodiment of the present invention, each wall surface of the first openings 14a, the second openings 14b and the pair of third openings 14c arranged in the low elastic modulus layer 14 has an inclination of less than 90° with respect to the surface of the semiconductor substrate 10. Instead, at least the portions near the upper end and the lower end of the wall surface of the openings 14a to 14c can have an inclination of less than 90° with respect to the surface of the semiconductor substrate 10.

In an embodiment of the present invention, the metallic balls are used as the first external electrode terminals 18 and the second external electrode terminals 19. Instead, conductive bumps or a portion of the land for high-speed signals 22 and a portion of the land for regular signals 23 may be used. However, in any case, it is preferable that the junctions of the lands for high-speed signals 22 and the first external electrode terminals 18 are covered with the solder resist film 17.

In an embodiment of the present invention, it is preferable to include the passivation film covering the surface of the semiconductor substrate 10 except the element electrodes 11 to 13 and that the low elastic modulus layer 14 is formed on the passivation film. This can further improve the reliability of the semiconductor device. In this case, the coils having ends, each of which is connected to a corresponding element electrode for coil connection 13 of the pair via the pad 21 can be formed on the passivation film, and the coils can be covered with the low elastic modulus layer 14.

In an embodiment of the present invention, the thickness of the low elastic modulus layer 14, that is, the thickness of the insulating material applied that is formed into the low elastic modulus layer 14 is set to about 20 μm. However, the present invention is not limited thereto, and it is also possible to set it within the range of 3 to 150 μm. However, the low elastic modulus 14 that is thicker to an extent that does not cause any problems in the process after the formation of the low elastic modulus layer 14 is better, and it is preferable to set it to about 50 μm or more.

In an embodiment of the present invention, there is no particular limitation regarding the insulating material that is formed into the low elastic modulus layer 14, as long as it is insulating polymer having a low elastic modulus. Examples of the insulating material include ester-bound polyimide, epoxy acrylate or the like.

In an embodiment of the present invention, it is preferable that the elastic modulus (Young's modulus) of the low elastic modulus layer 14 is within the range of 10 to 2000 kg/mm$^2$, and more preferably within the range of 10 to 1000 kg/mm$^2$. It is preferable that the coefficient of linear expansion of the low elastic modulus layer 14 is within the range of 5 to 200 ppm/C, and more preferably within the range of 10 to 100 ppm/C.

In an embodiment of the present invention, after the low elastic modulus layer 14 is formed on the semiconductor substrate 10 by applying a liquid insulating material having photosensitivity to the substrate and then drying it, the first openings 14a, the second openings 14b and the pair of the third openings 14c are formed on the low elastic modulus layer 14 by well-known techniques for exposure and development. Instead of this process, it is also possible to use a photosensitive insulating material in the form of film as the low elastic modulus layer 14 and to attach the film onto the semiconductor substrate 10, and then to form the openings 14a to 14c on the low elastic modulus layer 14 by well-known techniques for exposure and development.

In an embodiment of the present invention, the insulating material having photosensitivity is used as the layer of the low elastic modulus 14. Instead, it is also possible to use an insulating material that does not have photosensitivity. In this case, the openings 14a to 14c can be formed by performing a mechanical process using laser, plasma or the like or by performing a chemical process such as etching with respect to the low elastic modulus layer 14 made of the insulating material that does not have photosensitivity.

In an embodiment of the present invention, Cu is used as the metallic material constituting the thin metal layer 15 or the thick metal layer 16. Instead, it is also possible to use Cr, W, Ti, Ni, Au or the like. In the case of using different materials for the thin metal layer 15 and the thick metal layer 16, it is also possible to use an etchant that can selectively etch only the thin metal layer 15 in the etching process shown in FIG. 4B.

In an embodiment of the present invention, wet etching is performed with respect to the thin metal layer 15 in the etching process shown in FIG. 4B. Instead, it is also possible to perform dry etching. In this case, it is possible to protect the thick metal layer 16 by forming an etching resist film in the form of a predetermined pattern on the thick metal layer 16 by a well-known photolithography technique after removing the plating resist film 30. Although a resist of positive type is used in an embodiment of the present invention, a resist of negative type can also be used as the plating resist film 30 instead.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a semiconductor device comprising:
   a first step of forming on a semiconductor substrate on which at least one semiconductor element is provided a first element electrode and a second element electrode electrically connected to the semiconductor element;
   a second step of forming an insulating film so as to cover the first element electrode and the second element electrode;
   a third step of forming a first opening for exposing at least one portion of the first element electrode and a second opening for exposing at least one portion of the second element electrode by selectively removing the insulating film;
   a fourth step of forming first substantially continuous, thin conductive film on the insulating film and within the first and second openings;
   a fifth step of forming a second, thick conductive film selectively on the first, thin conductive film so as to fill up the first opening and the second opening and extend over portions of the first, thin conductive film between the first and second openings; and
   a sixth step of patterning the first and second conductive films by removing only an upper portion of the selectively formed second, thick conductive film and portions of the first, thin conductive film uncovered by the second, thick conductive film, thereby forming a first external electrode connected to the first element electrode via the first opening immediately above the first element electrode, forming a second external electrode and forming a connecting wire having one end connected to the second element electrode via the second opening and the another end connected to the second external electrode on the insulating film.

2. The method for producing a semiconductor device of claim 1, wherein the semiconductor substrate is a semiconductor wafer; and the method further composes a step of dividing the semiconductor wafer into chips after the fourth step.

3. The method for producing a semiconductor device of claim 1, wherein the semiconductor substrate is obtained by dividing a semiconductor wafer into chips.

4. The method for producing a semiconductor device of claim 1, wherein the insulating film is made of elastic insulating material.

5. The method for producing a semiconductor device of claim 1, wherein the third step comprises a step of forming the first opening and the second opening so that each wall surface of the openings has an inclination of less than 90° with respect to a surface of the semiconductor substrate.

6. The method for producing a semiconductor device of claim 1, wherein the third step comprises a step of forming the first opening and the second opening so that at least portions near the upper end and near the lower end of each wall surface of the openings have an inclination of less than 90° with respect to a surface of the semiconductor substrate.

7. The method for producing a semiconductor device of claim 1, wherein
   the first step comprises a step of forming a pair of third element electrodes electrically connected to the semiconductor element on the semiconductor substrate;
   the third step comprises a step of forming a pair of third openings for exposing at least one portion of each of the pair of third element electrodes by selectively removing insulating film; and
   the fourth, fifth and sixth steps forming a coil having ends, each of which is connected to a corresponding third element electrode via a corresponding third opening of the pair, on the insulating film.

8. The method for producing a semiconductor device of claim 1, further comprising a seventh step of forming a protective film having a property of repelling conductive material so as to cover the first external electrode, the second external electrode and the connecting wire and then selectively removing the protective film to form a fourth opening for exposing at least one portion of the first external electrode and a fifth opening for exposing at least one portion of the second external electrode, after the sixth step.

9. The method for producing a semiconductor device of claim 8, wherein the seventh step comprises a step of forming a first external electrode terminal connected to the first external electrode via the fourth opening immediately above the first external electrode and forming a second external electrode terminal connected to the second external electrode via the fifth opening immediately above the second external electrode.

10. The method for producing a semiconductor device of claim 1, wherein the first step comprises a step of forming a pair of third element electrodes electrically connected to the semiconductor element on the semiconductor substrate;
   the method further comprising, between the first step and the second step, a step of forming a passivation film covering a surface of the semiconductor substrate except the first element electrode, the second element electrode and the pair of third element electrodes, then
   forming a coil having ends, each of which is connected to a corresponding third element electrode of the pair, on the passivation film; and
   the insulating film covers the passivation film and the coil.

* * * * *

UNITED STATES PATENT AND TRADEMARK OFFICE
CERTIFICATE OF CORRECTION

PATENT NO. : 6,852,616 B2
DATED : February 8, 2005
INVENTOR(S) : Ryuichi Sahara et al.

It is certified that error appears in the above-identified patent and that said Letters Patent is hereby corrected as shown below:

Column 13,
Line 32, "provided a" should read -- provided, a --;
Line 63, "and the another" should read -- and another --;

Column 14,
Line 1, "composes" should read -- comprises --; and
Line 31, "forming" should read -- form --.

Signed and Sealed this

Eleventh Day of October, 2005

JON W. DUDAS
*Director of the United States Patent and Trademark Office*